United States Patent
Nohsoh et al.

(10) Patent No.: US 6,680,539 B2
(45) Date of Patent: *Jan. 20, 2004

(54) SEMICONDUCTOR DEVICE, SEMICONDUCTOR DEVICE PATTERN DESIGNING METHOD, AND SEMICONDUCTOR DEVICE PATTERN DESIGNING APPARATUS

(75) Inventors: Hiroyasu Nohsoh, Tokyo (JP); Hiroki Shinkawata, Tokyo (JP); Shinya Soeda, Tokyo (JP)

(73) Assignee: Renesas Technology Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/558,269

(22) Filed: Apr. 25, 2000

(65) Prior Publication Data

US 2002/0195712 A1 Dec. 26, 2002

(30) Foreign Application Priority Data

Nov. 29, 1999 (JP) .............................. 11-338437

(51) Int. Cl.⁷ ......................... H01L 23/48; H01L 23/52; H01L 29/40
(52) U.S. Cl. ....................... 257/758; 438/926
(58) Field of Search ............... 257/758, 775; 438/926, 183

(56) References Cited

U.S. PATENT DOCUMENTS

| 5,361,234 | A | * | 11/1994 | Iwasa | 257/303 |
| 5,386,382 | A | * | 1/1995 | Ahn | 257/296 |
| 5,441,915 | A | * | 8/1995 | Lee | 257/211 |
| 5,459,093 | A | * | 10/1995 | Kuroda et al. | 364/488 |
| 6,034,434 | A | * | 3/2000 | Bothra et al. | 257/758 |
| 6,103,626 | A | * | 8/2000 | Kim | 257/758 |
| 6,261,883 | B1 | * | 7/2001 | Koubuchi et al. | 438/197 |

FOREIGN PATENT DOCUMENTS

| JP | 7-74175 | | 3/1995 |
| JP | 08-181290 | * | 7/1996 |
| JP | 10-335333 | | 12/1998 |

* cited by examiner

Primary Examiner—Phat X. Cao
(74) Attorney, Agent, or Firm—McDermott, Will & Emery (57) ABSTRACT

Patterns to be included in a multi-layer wiring structure of a semiconductor device are designed layer by layer. Functional patterns 92 necessary for implementing functions of the semiconductor device are formed first. A plurality of types of dummy patterns 96 and 98 having different sizes are then designed in free regions not occupied by the functional patterns. While the dummy patterns are being designed, the largest possible number of free regions 94 are extracted followed by as many smaller free regions 97 as possible. The dummy patterns 98 are laid out in the extracted free regions.

3 Claims, 7 Drawing Sheets

PRIOR ART

Fig.8

SEMICONDUCTOR DEVICE, SEMICONDUCTOR DEVICE PATTERN DESIGNING METHOD, AND SEMICONDUCTOR DEVICE PATTERN DESIGNING APPARATUS

BACKGROUND OF THE INVENTION

1. Field of the Invention

The present invention relates to a semiconductor device, a semiconductor device pattern designing method, and a semiconductor device pattern designing apparatus. More particularly, the invention relates to a semiconductor device suitably structured to minimize wiring layer step differences thereof, as well as to a method and an apparatus for designing semiconductor device patterns suitable for minimizing their wiring layer step differences.

2. Description of the Background Art

Figure 8:
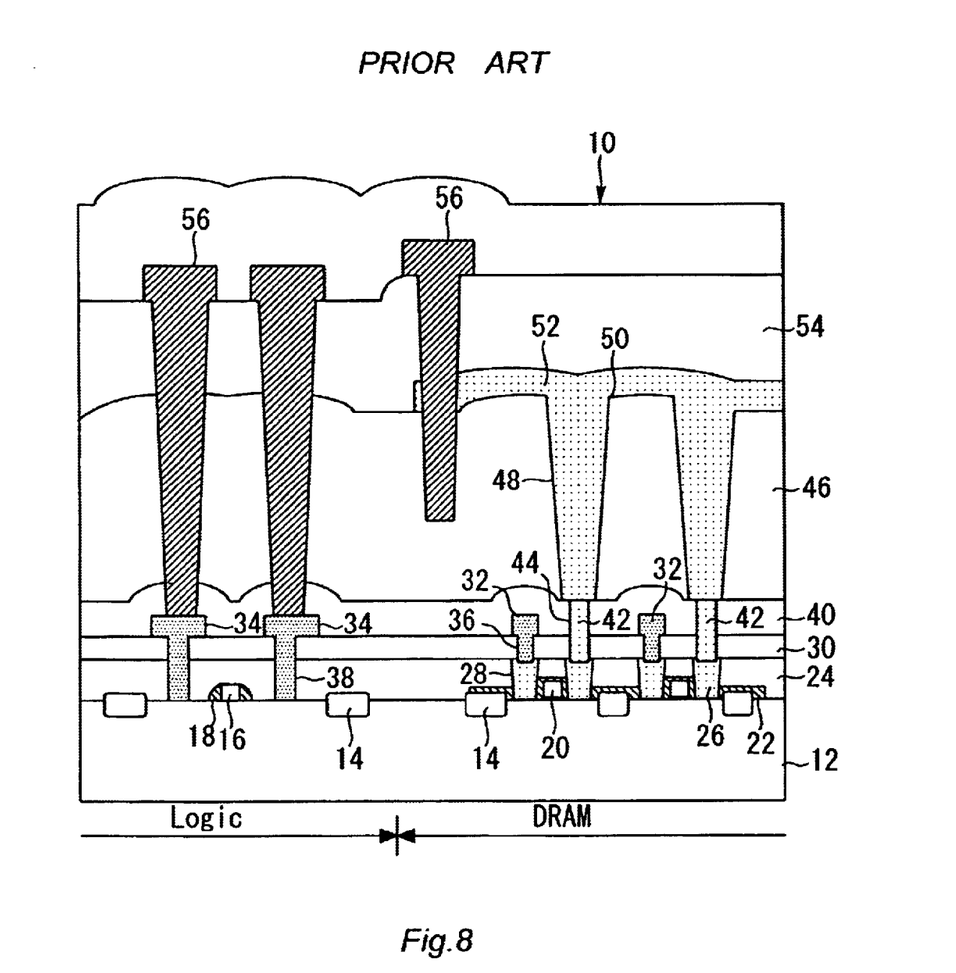
FIG. 8 is a cross-sectional view of a conventional semiconductor device.

FIG. 8 is a cross-sectional view of a conventional semiconductor device 10. The semiconductor device 10 is an eRAM (embedded device) that has a logic circuit and a DRAM (dynamic random access memory) mounted on a single substrate which is a silicon substrate 12. The silicon substrate 12 has an isolation oxide film 14 embedded therein, the film 14 having been formed by a shallow-trench process.

Formed on the silicon substrate 12 are gate electrodes 16 and side walls 18 which are components of the logic circuit, and transfer gates (TG) 20 and side walls 22 which are components of the DRAM. A first interlayer film 24 made of BPSG is formed on the gate electrodes 16 and transfer gates 20. The first interlayer film 24 has multiple contact plugs 26 conducting to active regions of the DRAM.

The contact plugs 26 are formed as follows: contact holes 28 to be opened in the active regions of the DRAM are first formed in the first interlayer film 24. Doped polysilicon is then deposited to fill the inside of the contact holes 28. Lastly, CMP (chemical mechanical polishing) is carried out to flatten the top of the first interlayer film 24 and the edges of the contact plugs 26.

A second interlayer film 30 made of TEOS is formed on the first interlayer film 24. The semiconductor device 10 includes bit lines 32 and metal wiring 34, the bit lines 32 penetrating the second interlayer film 30 to conduct to some of the contact plugs 26, the metal wiring 34 penetrating the first and second interlayer films 24 and 30 to conduct to the active regions of the logic circuit. The bit lines 32 and metal wiring 34 are formed as follows: contact holes 36 penetrating the second interlayer film 24 and contact holes 38 penetrating the first and second interlayer films 24 and 30 are formed first. Tungsten silicide (WSi) is then deposited all over the second interlayer film 30 to fill the inside of the contact holes 36 and 38. Lastly, the tungsten silicide (WSi) is patterned to desired shapes by photolithography and etching.

A third interlayer 40 made of TEOS is formed on the second interlayer film 30. The semiconductor device 10 has storage node contact plugs (SC plugs) 42 that penetrate the second and third interlayer films 30 and 40 to conduct to some of the contact plugs 28. The SC plugs 42 are formed as follows: contact holes 44 penetrating the second and third interlayer films 30 and 40 are first formed. Doped polysilicon is then deposited to fill the inside of the contact holes 44. Lastly, CMP is performed to flatten the top of the third interlayer film 40 and the edges of the SC plugs 42.

A fourth interlayer film 46 made of BPSG is formed on the third interlayer film 40. The fourth interlayer film 46 has openings 48 that lead to the SC plugs 42. The inner walls of the openings 48 and the surfaces of the SC plugs 42 are covered with an insulating film 50. A cell plate 52 made of doped polysilicon is formed to fill inside voids enclosed by the insulating film 50 and cover the fourth interlayer film 46. The cell plate 52 is formed as follows: openings 48 penetrating the fourth interlayer film 46 are first formed. The insulating film 50 is formed so as to cover inside the openings 48. Doped polysilicon is then deposited all over the fourth interlayer film 46 to fill the inside of the openings 48. Lastly, the doped polysilicon is patterned to desired shapes by photolithography and etching.

On an eRAM such as the semiconductor device 10, the cell plate 52 is formed only in the DRAM area. Once the cell plate 52 is formed, its film thickness tends to cause a step difference in elevation between the DRAM area and the logic circuit area.

A fifth interlayer film 54 is formed on the fourth interlayer film 46 so as to cover the cell plate 52. The semiconductor device 10 has multiple metal wires 56 conducting to the cell plate 52 and to the metal wiring 34. The metal wires 56 are formed as follows: openings are first made in the fifth interlayer film 54 and fourth interlayer film 46. Then barrier metal (e.g., TiN: 15 nm) and wiring material (e.g., AlCu: 150 nm) are deposited all over the fifth interlayer film 54 to fill these openings. Lastly, the deposited films are patterned to desired shapes by photolithography and etching. The above processes are repeated as many times as needed to form a multiple-layer wiring structure.

An eRAM such as the semiconductor device 10 has a pattern like the cell plate 52 that exists only in one of the DRAM and the logic circuit. The presence of such a pattern leads to a step difference at the pattern top between the DRAM area and the logic circuit area. The step difference formation tends to reduce margins for photolithography and is liable to produce faulty contact hole openings or to degrade wiring pattern precision. The CMP process intended to reduce the step difference can result in an irregular polish because of the bumpy surface to be polished.

SUMMARY OF THE INVENTION

It is therefore a first object of the present invention to overcome the above and other disadvantages of the prior art and to provide a semiconductor device having dummy patterns for ensuring the flatness of wiring layers.

It is a second object of the present invention to provide a pattern designing method for designing wiring patterns which include dummy patterns suitable for ensuring the flatness of wiring layers.

It is a third object of the present invention to provide a pattern designing apparatus for designing wiring patterns by use of the above-mentioned inventive pattern designing method.

The above objects of the present invention are achieved by a semiconductor device having a multi-layer wiring structure. The device includes functional patterns necessary for implementing functions of the semiconductor device. The device also includes dummy patterns formed together with the functional patterns in selected layers. The dummy patterns are constituted by a plurality of patterns having different sizes.

The above objects of the present invention are also achieved by a semiconductor device pattern designing method for designing patterns of a semiconductor device having a multi-layer wiring structure. The method includes pattern designing processes each provided for individual layer included in the multi-layer wiring structure. In each of the pattern designing processes, functional patterns are designed for implementing functions of the semiconductor device, then a plurality of types of dummy patterns are designed so as to have different sizes in free regions not occupied by the functional patterns. For designing the dummy patterns, the first and second sub-steps described below are repeatedly performed. In the first sub-step, dummy patterns of a predetermined size are laid-out as many as possible in the free regions. In the second sub-step, the predetermined size of the dummy patterns is made smaller.

The above objects of the present invention are further achieved by a semiconductor device pattern generating apparatus for designing patterns of a semiconductor device having a multi-layer wiring structure. The apparatus includes pattern designing unit each provided for individual layer included in the multi-layer wiring structure. Each of the pattern designing unit has a functional pattern designing unit for designing functional patterns necessary for implementing functions of the semiconductor device as well as a dummy pattern designing unit for designing a plurality of types of dummy patterns having different sizes in free regions not occupied by the functional patterns. The dummy pattern designing unit performs repeatedly the steps of: laying out as many dummy patterns of a predetermined size as possible in the free regions; and making the predetermined size of the dummy patterns smaller after the laying-out step.

Other objects and further features of the present invention will be apparent from the following detailed description when read in conjunction with the accompanying drawings.

DESCRIPTION OF THE PREFERRED EMBODIMENTS

Figure 1:
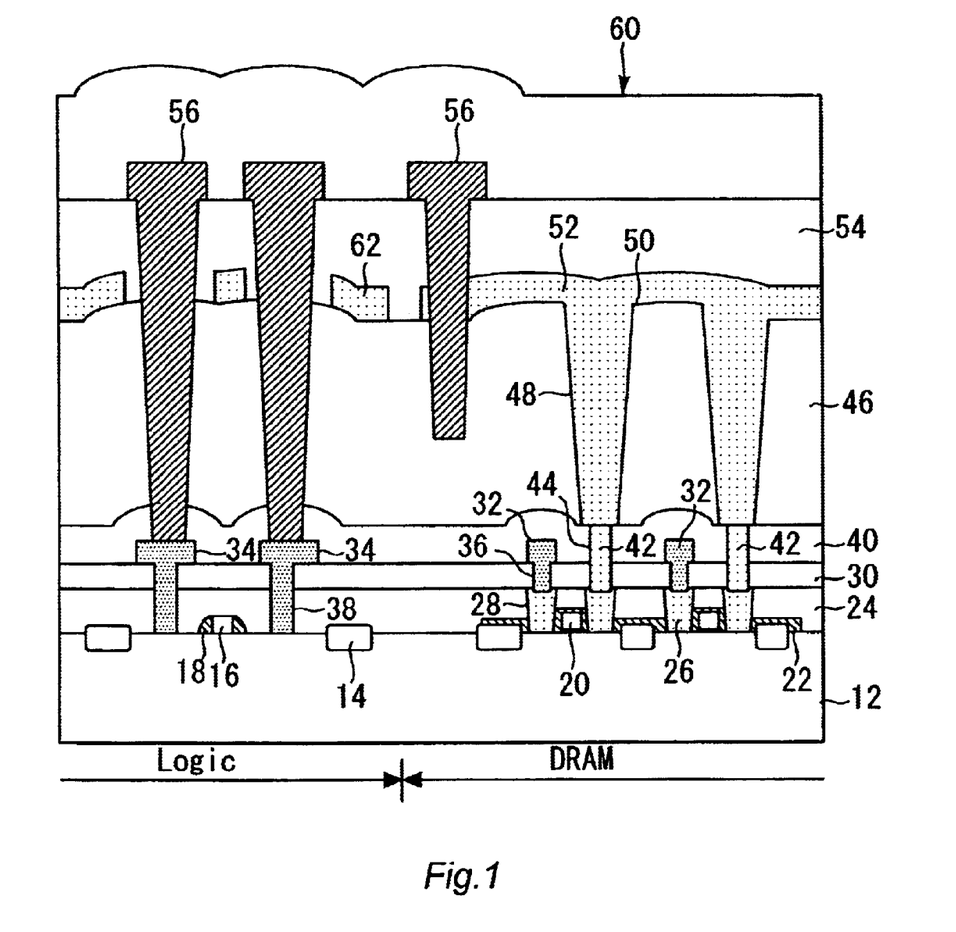
FIG. 1 is a cross-sectional view of a semiconductor device practiced as a first embodiment of this invention.

The best mode of carrying out this invention will now be described with reference to the accompanying drawings. Throughout the drawings, like reference characters designate like or corresponding parts, and their repetitive descriptions are omitted where appropriate.
First Embodiment FIG. 1 is a cross-sectional view of a semiconductor device 60 practiced as the first embodiment of this invention. The semiconductor device 60 is an eRAM that has a logic circuit and a DRAM (dynamic random access memory) mounted on a single substrate which is a silicon substrate 12. The silicon substrate 12 has an isolation oxide film 14 embedded therein, the film 14 having been formed by a shallow-trench process.

Formed on the silicon substrate 12 are gate electrodes 16 and side walls 18 which are components of the logic circuit, and transfer gates (TG) 20 and side walls 22 which are components of the DRAM. A first interlayer film 24 made of BPSG is formed on the gate electrodes 16 and transfer gates 20. The first interlayer film 24 has multiple contact plugs 26 conducting to active regions of the DRAM.

The contact plugs 26 are formed as follows: contact holes 28 to be opened in the active regions of the DRAM are first formed in the first interlayer film 24. Doped polysilicon is then deposited to fill the inside of the contact holes 28. Lastly, CMP is performed to flatten the top of the first interlayer film 24 and the edges of the contact plugs 26.

A second interlayer film 30 made of TEOS is formed on the first interlayer film 24. The semiconductor device 60 includes bit lines 32 and metal wiring 34, the bit lines 32 penetrating the second interlayer film 30 to conduct to some of the contact plugs 28, the metal wiring 34 penetrating the first and second interlayer films 24 and 30 to conduct to the active regions of the logic circuit. The bit lines 32 and metal wiring 34 are formed as follows: contact holes 36 penetrating the second interlayer film 24 and contact holes 38 penetrating the first and second interlayer films 24 and 30 are formed first. Tungsten silicide (WSi) is then deposited all over the second interlayer film 30 to fill the inside of the contact holes 36 and 38. Lastly, the tungsten silicide (WSi) is patterned to desired shapes by photolithography and etching.

A third interlayer 40 made of TEOS is formed on the second interlayer film 30. The semiconductor device 60 has SC plugs 42 that penetrate the second and third interlayer films 30 and 40 to conduct to some of the contact plugs 28. The SC plugs 42 are formed as follows: contact holes 44 penetrating the second and third interlayer films 30 and 40 are first formed. Doped polysilicon is then deposited to fill the inside of the contact holes 44. Lastly, CMP is performed to flatten the top of the third interlayer film 40 and the edges of the SC plugs 42.

A fourth interlayer film 46 made of BPSG is formed on the third interlayer film 40. The fourth interlayer film 46 has openings 48 that lead to the SC plugs 42. The inner walls of the openings 48 and the surfaces of the SC plugs 42 are covered with an insulating film 50. A cell plate 52 made of doped polysilicon is formed inside voids enclosed by the insulating film 50 and over the fourth interlayer film 46.

In the first embodiment, a dummy pattern 62 made of the same material as the cell plate 52 (i.e., doped polysilicon) is formed on the fourth interlayer film 46. The dummy pattern 62 is furnished in the logic circuit area so as not to interfere with any other wiring members included in the semiconductor device 60. It is noted that, in this specification, the dummy pattern refers to a pattern that is dispensable for ensuring the essential functions of the semiconductor device 60. On the other hand, all patterns necessary for enabling the functions of the semiconductor device 60 (such as bit lines 32, metal wiring 34, and side walls 18 and 22) are referred to as functional patterns.

The cell plate 52 and dummy pattern 62 are formed as follows: openings 48 penetrating the fourth interlayer film 46 are first formed. Doped polysilicon is then deposited all over the fourth interlayer film 46 to fill the inside of the openings 48. Lastly, the doped polysilicon is patterned to previously designed shapes, i.e., to the shapes of the cell plate 52 and dummy pattern 62, by photolithography and etching.

In an eRAM such as the semiconductor device 60, the cell plate 52 is formed only in the DRAM area. If the dummy pattern 62 were absent, the formation of the cell plate 52 would produce a step difference in elevation between the DRAM area and the logic circuit area. With this embodiment, forming the dummy pattern 62 in the logic circuit area effectively inhibits creation of the above-described step difference between the DRAM area and the logic circuit area.

A fifth interlayer film 54 is formed on the fourth interlayer film 46 so as to cover the cell plate 52 and dummy pattern 62. The surface of the fifth interlayer film 54 is flattened by CMP. With the first embodiment, the layer immediately below the fifth interlayer film 54 has already been flattened as described above. For that reason, the polish characteristic brought about by the CMP process for flattening the fifth interlayer film 54 turns out to be substantially uniform all over the surface of interest. As a result, the surface of the fifth interlayer film 54 is assured of far better flatness than if the dummy pattern 62 were not provided.

The semiconductor device 60 has multiple metal wires 56 conducting to the cell plate 52 and to the metal wiring 34. The metal wires 56 are formed as follows: openings are first made in the fifth interlayer film 54 and fourth interlayer film 46. Then barrier metal (e.g., TiN: 15 nm) and wiring material (e.g., AlCu: 150 nm) are deposited all over the fifth interlayer film 54 to fill these openings. Lastly, the deposited films are patterned to desired shapes by photolithography and etching.

The above processes are repeated as many times as needed to form a multiple-layer wiring structure. Although the dummy pattern 62 is shown existing only in the wiring layer containing the cell plate 52 in FIG. 1, the dummy patterns are in fact included in all wiring layers on which unevenness may arise due to the presence of the functional patterns so as to enhance the flatness of these layers.

Described below with reference to FIGS. 2 through 6 are characteristics of dummy patterns (including the dummy pattern 62), a method for designing these dummy patterns, and a pattern designing apparatus for automatically designing the dummy patterns.

Figure 2:
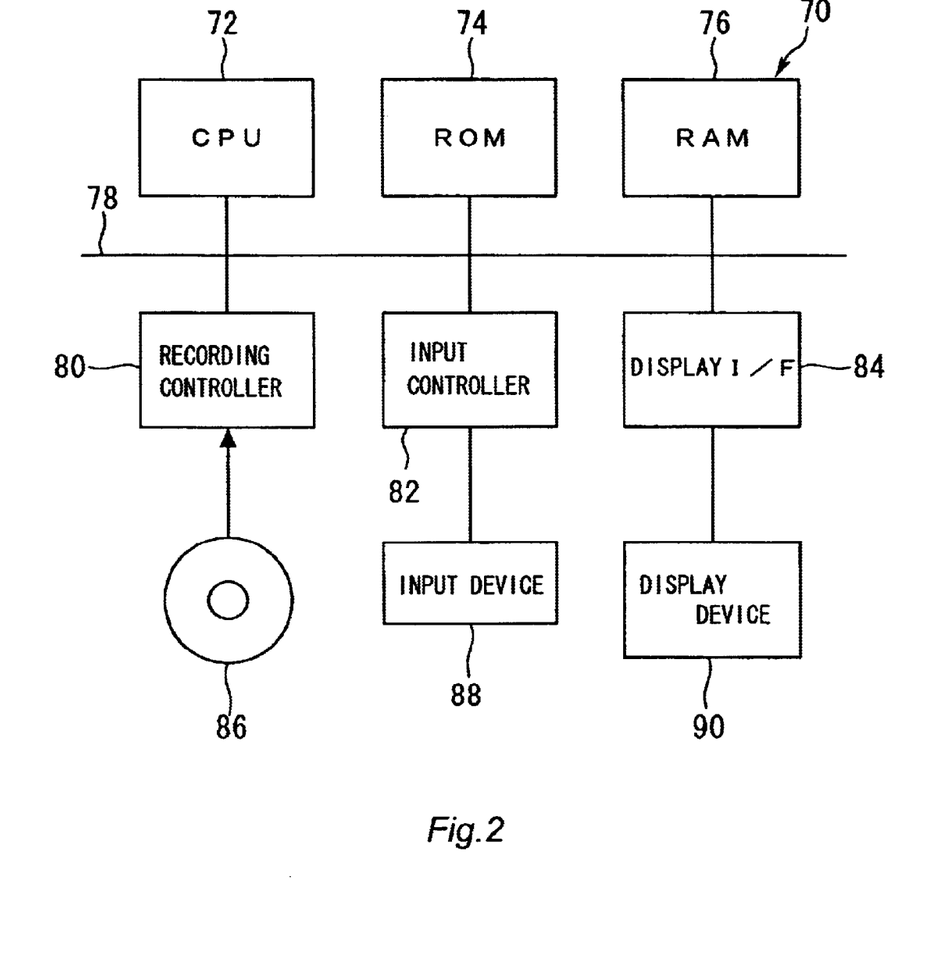
FIG. 2 is a block diagram of a pattern designing apparatus for designing the first embodiment.

FIG. 2 is a block diagram of a pattern designing apparatus 70 for designing the semiconductor device practiced as the first embodiment. The pattern designing apparatus 70 may be implemented by use of a computer system having a common hardware configuration. Specifically, the pattern designing apparatus 70 has a CPU 72, a ROM 74 and a RAM 76. These components are interconnected by a bus line 78. The bus line 78 is also connected to a recording controller 80, an input controller 82, and a display interface (I/F) 84.

The recording controller 80 is a device that writes and reads data to and from a recording medium 86 such as a hard disc or a CD-ROM. The input controller 82 receives input signals from an input device 88 such as a keyboard or a mouse and outputs these signals onto the bus line 78. The display interface 84 generates images to be displayed on a display device 90.

In the pattern designing apparatus 70, the CPU 72 designs dummy patterns or the like by executing processes, to be described later, employing programs and data loaded from the recording medium 86 into the RAM 76. Below is a description of typical steps carried out by the pattern designing apparatus 70 designing patterns including a dummy pattern.

Figure 3:
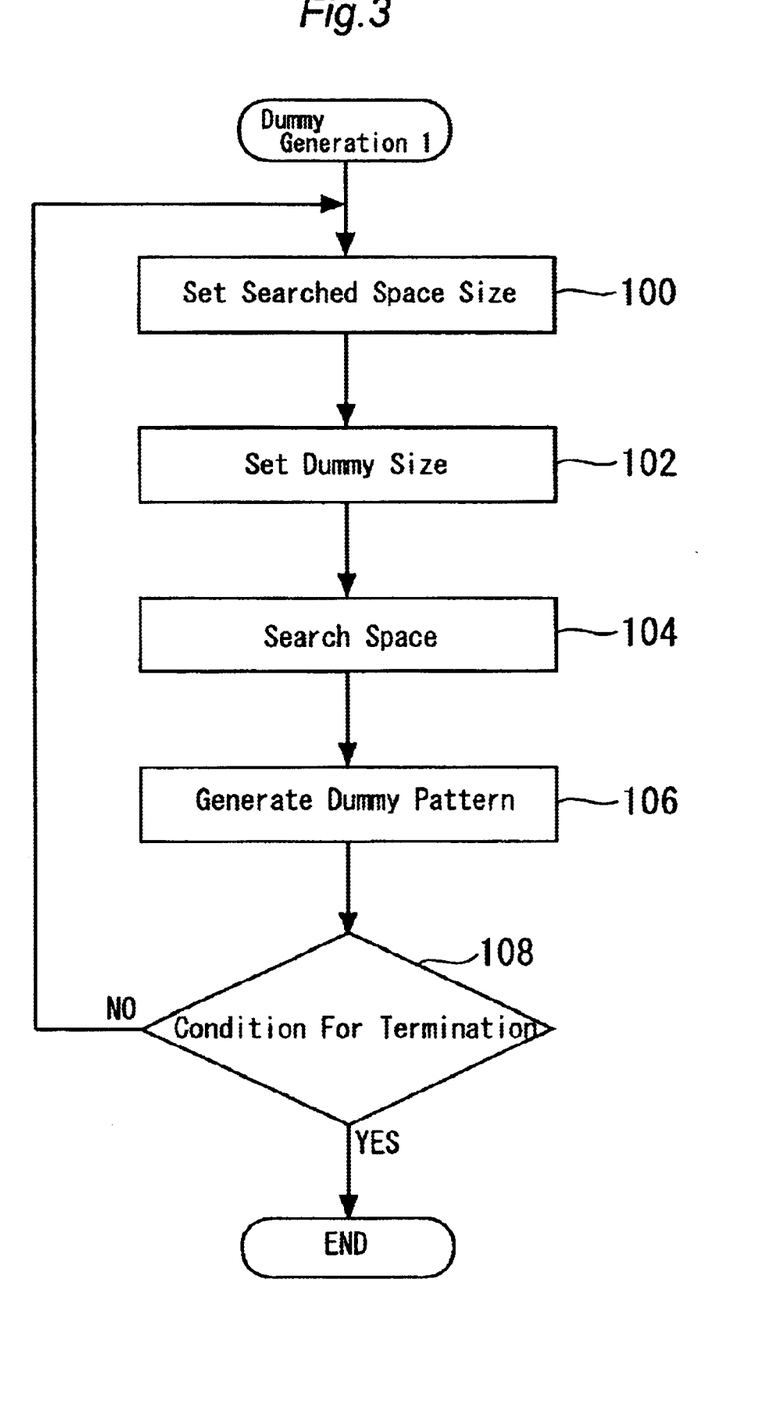
FIG. 3 is a flowchart of steps constituting a routine used by the pattern designing apparatus of FIG. 2 in designing dummy patterns.

FIG. 3 is a flowchart of steps constituting a first routine performed by the pattern designing apparatus 70 in generating dummy patterns. The routine of FIG. 3 is carried out after termination of the design of functional patterns to be included in each wiring layer. In the design process of the semiconductor device 60 in FIG. 1, the routine of FIG. 3 is executed illustratively after completion of the design of the cell plate 52 to be formed over the fourth interlayer film 46.

Step 100 of FIG. 3 is carried out to set the size of a space to be extracted as a region in which to lay out a dummy pattern from among free regions (i.e., regions not occupied by the functional patterns) included in the target layer. The extracted space is called a searched space hereunder. In step 100, the searched space is set illustratively as a square region measuring 10 $\mu$m on each side.

Step 102 is carried out to set the size of a dummy pattern corresponding to the size of the searched space established as described. In step 102, the dummy pattern size is set as a square region measuring 7 $\mu$m on each side when the searched space is of the square region measuring 10 $\mu$m on each side, illustratively.

Step 104 is performed to extract from the free region in the target wiring layer the searched spaces having the size established in step 100 above.

Step 106 is carried out to generate in each of the extracted searched space the dummy pattern established in step 102 above.

Figure 4:
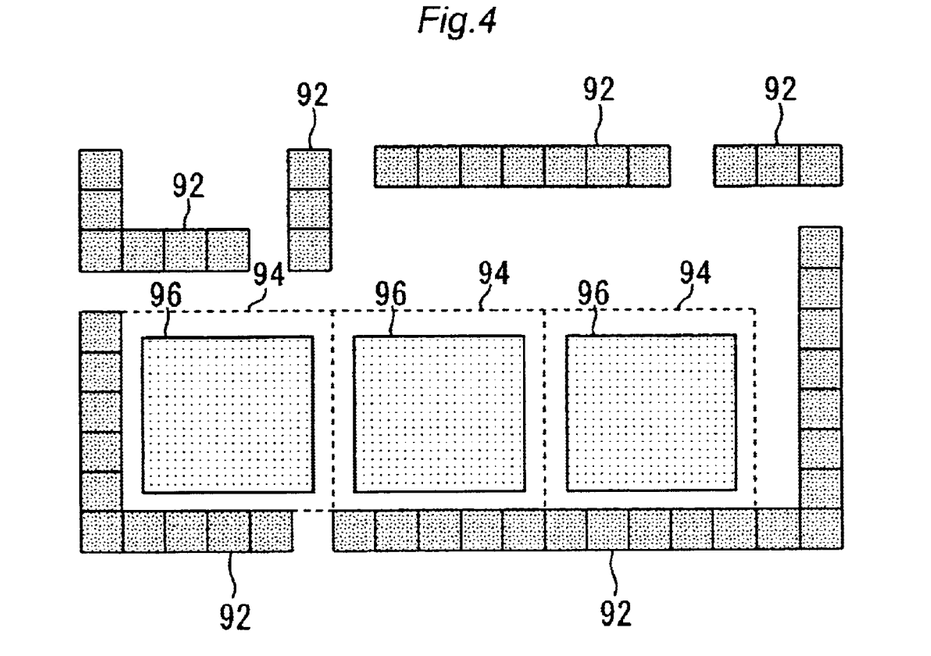
FIG. 4 is a plan view of wiring patterns including one dummy pattern created by the routine of FIG. 3.

FIG. 4 shows typical wiring patterns designed by the above-described routine. In FIG. 4, reference numeral 92 denotes a functional pattern of the semiconductor device 60, and reference numeral 94 represents a free region measuring 10 $\mu$m on each side. Reference numeral 96 stands for a dummy pattern established by execution of step 106 above. As illustrated in FIG. 4, the inventive pattern designing method allows a plurality of dummy patterns 96 identical in size and shape to be laid out in an orderly fashion in the free region of the wiring layer of interest.

In step 108, a check is made to see if a condition for terminating dummy pattern generation is met. With the first embodiment, the condition for the termination of dummy pattern generation is judged to be met if the size of the dummy pattern generated in step 106 above is less than a predetermined size or if the occupying rate of the patterns in the target wiring layer (i.e., how much of the wiring layer is occupied by the functional and dummy patterns) is greater than a predetermined rate. If the check of step 108 reveals that the condition has yet to be met, step 100 is reached again and the subsequent steps are repeated. If the condition is judged to be met, this processing cycle is brought to an end.

When step 100 is again performed, the size of the searched space is set to be smaller than the size established in the preceding processing cycle. For example, the searched space established in the first processing cycle as the square region measuring 10 $\mu$m on each side is changed to a square region measuring 4 $\mu$m on each side.

When step 102 is again carried out, the size of the dummy pattern is modified. For example, the dummy pattern established in the first processing cycle as the square region measuring 7 $\mu$m on each side is changed to a square region measuring 3 $\mu$m on each side following with the searched region measuring 4 $\mu$m on each side of the square.

Figure 5:
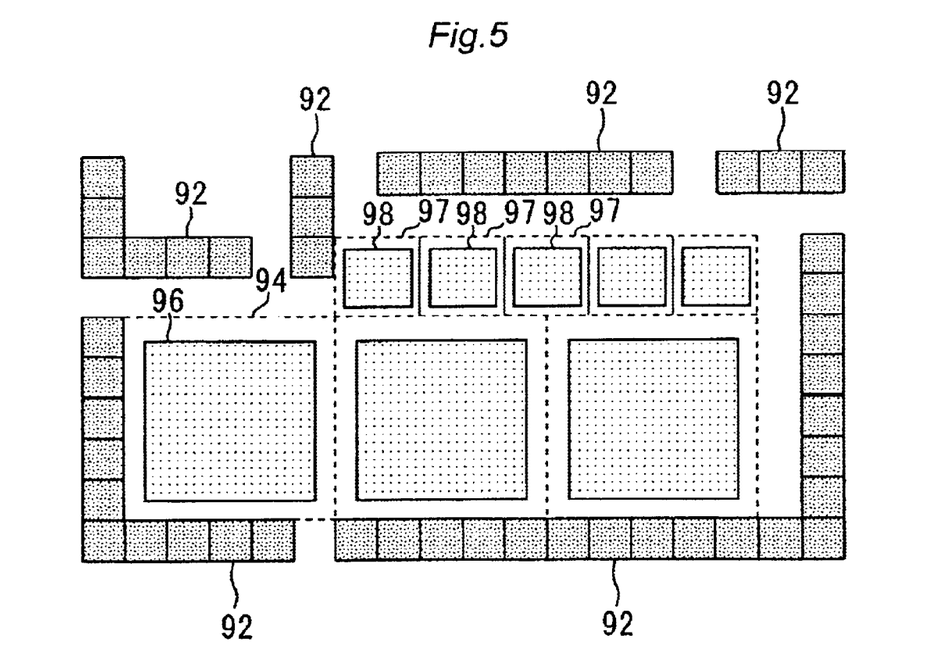
FIG. 5 is a plan view of wiring patterns including two dummy patterns created by the routine of FIG. 3.

FIG. 5 depicts typical wiring patterns designed by execution of steps 104 and 106 after the searched space and dummy pattern were set as described above. In FIG. 5, reference numeral 97 denotes a free square region measuring 4 $\mu$m on each side, and reference numeral 98 represents a dummy pattern measuring 3 $\mu$m on each side. As illustrated in FIG. 5, the inventive pattern designing method allows a plurality of dummy patterns identical in size and shape to be laid out in an orderly fashion in the free regions that were not capable of accommodating the dummy pattern 96.

When smaller dummy patterns 98 are laid out in free region which is incapable of containing the larger dummy pattern 96, the pattern occupying rate in the wiring layer of interest is boosted compared with the case in which the larger dummy patterns are solely employed. The increased pattern occupying rate in turn makes uniform the pattern concentration all over the wiring layer regardless of the distribution of functional patterns therein. In addition, the orderly layout of multiple dummy patterns identical in size and shape helps improve the pattern occupying rate of the first embodiment.

When an interlayer film over a wiring layer is to be polished by CMP, it is required, in view of preventing the emergence of the pattern-dependency of CMP, that the pattern occupying rate of the wiring layer be high and that the patterns be distributed uniformly all over the wiring layer in question. According to the inventive method, the requirements above are met effectively by laying out the multiple dummy patterns in an orderly fashion. As opposed to cases where dummy patterns are not formed or are designed merely under a particular rule, the inventive method contributes to affording good flatness to individual layers contained in a multi-layer wiring structure.

Figure 6:
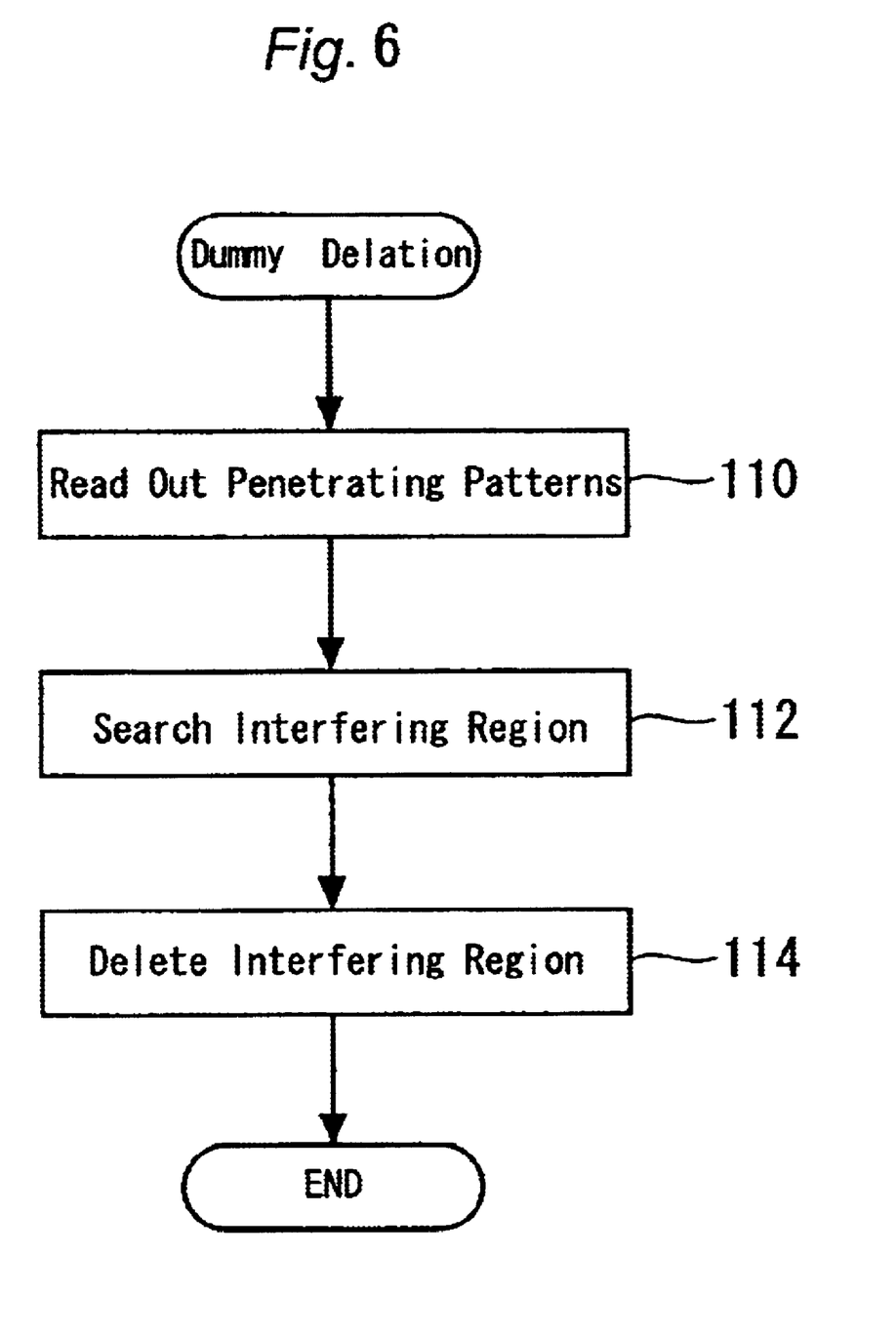
FIG. 6 is a flowchart of steps constituting a routine used by the pattern designing apparatus of FIG. 2 in deleting unnecessary parts of a dummy pattern.

FIG. 6 is a flowchart of steps constituting a routine used by the pattern designing apparatus 70 to delete unnecessary parts of a dummy pattern. The routine of FIG. 6 is executed after termination of the design of dummy patterns to be included in each wiring layer. More specifically, the routine is carried out after the routine of FIG. 3 has been executed and terminated on each target wiring layer.

In step 110 of FIG. 6, any pattern penetrating the target wiring layer is read out. Illustratively, the pattern such as that of metal wires 56 shown in FIG. 1 is read out. The pattern read in step 110 is called the penetrating pattern hereunder.

Step 112 is carried out to search for any region that may possibly interfere interfering with the penetrating pattern among the designed dummy patterns (the region is called the interfering region hereunder). This embodiment regards as the interfering region the region determined by supplementing the penetrating pattern size with process margins for displacements stemming from photolithography.

In step 114, the interfering region is deleted from the designed dummy patterns. Executing the steps above creates a dummy pattern such as the pattern 62 in FIG. 1 which is free of interference with the wiring members like the metal wires 56. When the above steps have been completed, the current processing cycle comes to an end.

As described, the pattern designing apparatus 70 of this invention permits designing of dummy patterns which are free of interference with other wiring members in individual wiring layers and which are effective in preventing the pattern-dependency of CMP. The use of such dummy patterns makes it possible to improve the accuracy of wiring layers without affecting the functions of the semiconductor device 60. Thus the first embodiment of the invention, when implemented as described, provides semiconductor devices 60 of unfailing quality which are manufactured at enhanced yield rates.

Second Embodiment

Figure 7:
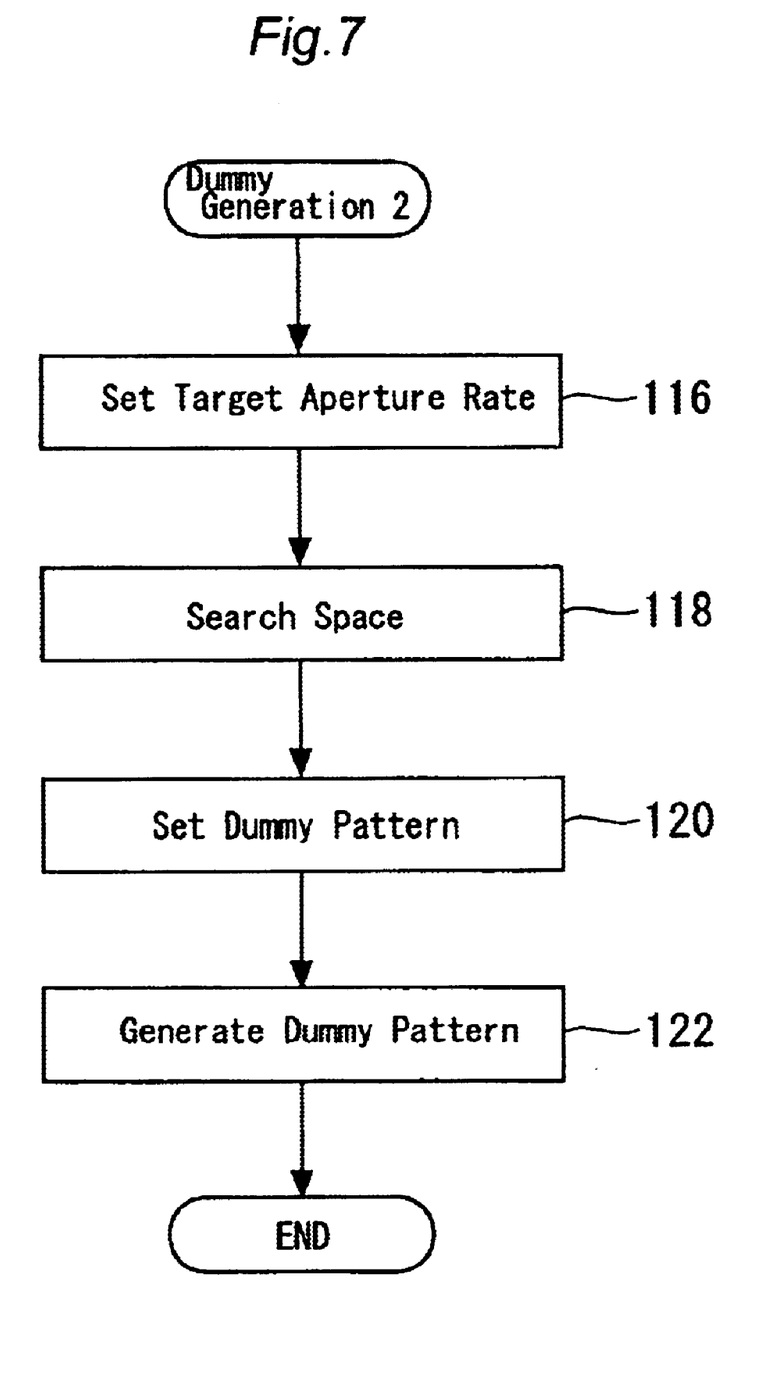
FIG. 7 is a flowchart of steps constituting a routine used by a pattern designing apparatus for designing a second embodiment of this invention.

Described below with reference to FIG. 7 is a pattern designing apparatus practiced as a second embodiment of the invention. This pattern designing apparatus is implemented by getting the apparatus of FIG. 2 to execute a routine shown in FIG. 7.

If the semiconductor device in question has a sufficiently fine structure, then process windows for etching the structure, i.e., the range of etching conditions under which to acquire adequate precision in fabricating the device, vary with the aperture rate of the mask used for photolithography. Table 1 below lists typical data representing process windows of etching for making the contact holes 28 shown in FIG. 1. In Table 1, each term "OK" indicates that contact holes may be suitably made under the corresponding condition without entailing etching residue. The data in Table 1 show a distinctive tendency: the forming of contact holes is more likely to be defective the smaller the aperture rate of the mask and the longer the time period over which an etching chamber is used.

TABLE 1

| | | Aperture rate of mask (%) | | | | |
|---|---|---|---|---|---|---|
| | | 100 | 50 | 20 | 10 | 8 |
| Chamber | 0 | OK | OK | OK | OK | OK |
| usage | 50 | OK | OK | OK | OK | OK |
| time | 70 | OK | OK | OK | OK | Residue found |
| (hrs) | 100 | OK | OK | OK | Residue found | Residue found |

For eRAMs like the semiconductor device 60, it is rare, if ever, to set up a production line dedicated to an individual product type. That is, in view of production efficiency, these eRAMs are usually fabricated by a general-purpose production line for manufacturing a plurality of types of products.

The proportions of the logic circuit and DRAM in eRAMs vary significantly depending on product specification. Similarly, the ratio of functional patterns in the logic circuit and DRAM occupying each wiring layer varies depending on product specification and the like. It follows that the aperture rates of masks for transferring the functional patterns to a given eRAM also vary considerably depending on product specification.

On a general-purpose production line, a plurality of wiring layers whose process windows do not overlap may become subject to an etching process. If the conditions for etching are assumed to be constant, these conditions may be out of the process windows with regard to some wiring layers. This means that the functional patterns of some wiring layers are more liable to be faulty than those of other wiring layers. Such potential defects of functional patterns may be forestalled by modifying the etching conditions in keeping with the aperture rate of the mask used for each wiring layer. This method, however, tends to worsen productivity of the eRAM in question because the etching conditions need to be verified every time a condition modification is requested.

The aperture rates of masks for transferring functional patterns to a given eRAM are enhanced by supplementing these patterns with dummy patterns. Providing suitable dummy patterns to individual wiring layers harmonizes the aperture rates of masks for the multiple wiring layers. That in turn harmonizes the process windows of etching for all products to be handled by the general-purpose production line. With the process windows harmonized for all products, it is possible appropriately to etch the functional patterns of all products while keeping the etching conditions constant. This scheme permits efficient fabrication of multiple types of eRAMs on a single general-purpose production line.

FIG. 7 is a flowchart of steps constituting a routine used by a pattern designing apparatus adopting the above inventive scheme to design wiring patterns. The routine of FIG. 7 is carried out after their functional patterns have been designed on all wiring layers to be etched for pattern formation.

In step 116, a target mask aperture rate is established. The target aperture rate is commonly used for all wiring layers to be handled by the same general-purpose production line.

Step 118 is executed to search free regions of the target wiring layer for a free region in which to generate a dummy pattern.

Step 120 is carried out to determine the size and layout of a dummy pattern to be generated in the selected free region. In this step, the size and layout of the functional pattern included in the target wiring layer are set as those of the dummy pattern. More specifically, if the free region is found illustratively in the logic circuit area, the size and layout of the functional pattern in the DRAM area are established to serve as the size and layout of the dummy pattern.

When the size and layout of the dummy pattern are set as described, it is possible to standardize the sizes and layouts of all patterns included in the same wiring layer. Because the functional patterns will be verified for their reliability later, designing the dummy pattern after the functional patterns indirectly ensures its reliability.

Step 122 is executed to generate the dummy pattern thus designed in the selected free space. This completes the current processing cycle.

Carrying out the steps above generates, in a free region of a given wiring layer, a dummy pattern same as the functional pattern of the layer in question. Even if the mask aperture rate is low (e.g., 8% or less in Table 1) in conjunction with the functional pattern alone, generation of a dummy pattern under the above-described scheme brings the aperture rate to a sufficiently large value. The pattern designing method of this embodiment thus enhances productivity of eRAMs by overlapping the process windows of all wiring layers included in multiple types of products.

With the second embodiment, dummy patterns of a single kind were shown to be formed in a free region. However, this is not limitative of the invention. As with the first embodiment, dummy patterns of a plurality kind may also be generated. Forming multiple kinds of dummy patterns in each free region boosts the occupying rate of the wiring patterns involved, whereby the aperture rates of masks are increased and wiring layer flatness is enhanced.

With the first and second embodiments above, the eRAM was shown incorporating a DRAM and a logic circuit. However, this is not limitative of the invention. The eRAM may contain an SRAM in place of or in addition to the DRAM.

This invention, when embodied as described, offers the following major benefits:

According to one aspect of the invention, there is provided a semiconductor device having a multi-layer wiring structure wherein large proportions of each component wiring layer are occupied by functional patterns and by a plurality of types of dummy patterns. The inventive structure allows the semiconductor device to be implemented with good flatness over each layer.

In a preferred structure according to the invention, the semiconductor device may be modified to prevent the dummy patterns from interfering with the functional patterns. This allows the semiconductor device to function normally independently of the formation of the dummy patterns.

In another preferred structure according to the invention, the semiconductor device may be modified to include a dummy pattern having the same pattern as that of any one functional pattern of the memory device in the logic circuit area. This preferred structure may fill the logic circuit and memory device areas with analogous patterns so as to prevent effectively the pattern dependency of CMP.

According to another aspect of the invention, multiple types of dummy patterns having different sizes are laid out in an orderly fashion in free regions so that large proportions of the free regions are filled with the dummy patterns. This makes it possible to design easily the patterns suitable for ensuring good flatness of each wiring layer.

According to the invention, any portions of the dummy patterns which are liable to interfere with the functional patterns may preferably be deleted from the dummy patterns to forestall any interference between the two kinds of patterns. This makes it possible to design dummy patterns such that the functions of the semiconductor device will not be impaired.

According to the invention, the mask aperture rate of every layer to be etched may preferably be matched with the target mask aperture rate. That is, the process windows for the etching of all layers may be harmonized. This makes it possible to design easily the patterns suitable for efficiently producing semiconductor devices on a general-purpose production line.

Also according to the invention, a dummy pattern having the same pattern as any one functional pattern of the memory circuit may preferably be generated in any free region of the logic circuit. This makes it possible to design easily those patterns that are suitable for preventing the pattern dependency of CMP.

Further, the present invention is not limited to these embodiments, but variations and modifications may be made without departing from the scope of the present invention.

The entire disclosure of Japanese Patent Application No. Hei 11-338437 filed on Nov. 29, 1999 including specification, claims, drawings and summary are incorporated herein by reference in its entirety.

What is claimed is:

1. A semiconductor device having a multi-layer wiring structure, comprising:
   functional patterns necessary for implementing functions of said semiconductor device; and
   dummy patterns formed together with said functional patterns in a selected layers of said semiconductor device, said selected layers defining a region free from functional patterns;
   wherein said dummy patterns comprise a dummy pattern larger than at least one dummy pattern;
   wherein any of said at least one other dummy pattern that does not neighbor any other of the at least one other dummy pattern, or any set of said at least one other dummy pattern neighboring to each other and without any other of the at least one other dummy pattern neighboring to the set, is positioned in a portion of said region incapable of accommodating said dummy pattern; and
   wherein an occupying rate representing the portion of said selected layers occupied by said dummy patterns and said functional patterns is greater than a predetermined rate such that pattern concentration is substantially uniform over said selected layer.

2. The semiconductor device of claim 1, wherein said functional patterns include wiring members penetrating at least one wiring layer, and wherein said dummy patterns are formed so as not to interfere with said wiring members.

3. The semiconductor device according to claim 2, further comprising:
   a memory area in which to form functional patterns constituting components of a memory device; and
   a logic circuit area in which to form functional patterns constituting components of a logic circuit;
   wherein any one of said dummy patterns formed in said logic circuit area has the same pattern as that of any one of said functional patterns for said memory circuit formed in the same layer as the dummy pattern in question.

* * * * *